United States Patent
Howell et al.

(10) Patent No.: US 7,126,446 B2
(45) Date of Patent: Oct. 24, 2006

(54) SELF-RETRACTING FULLY COMPLIANT BISTABLE MICROMECHANISM

(75) Inventors: Larry Howell, Orem, UT (US); Nathan Masters, Atlanta, GA (US)

(73) Assignee: Brigham Young University, Provo, UT (US)

( * ) Notice: Subject to any disclaimer, the term of this patent is extended or adjusted under 35 U.S.C. 154(b) by 148 days.

(21) Appl. No.: 10/480,367

(22) PCT Filed: Jun. 14, 2002

(86) PCT No.: PCT/US02/18769

§ 371 (c)(1),
(2), (4) Date: Dec. 10, 2003

(87) PCT Pub. No.: WO03/003396

PCT Pub. Date: Jan. 9, 2003

(65) Prior Publication Data

US 2004/0183632 A1    Sep. 23, 2004

Related U.S. Application Data

(63) Continuation-in-part of application No. PCT/US01/28614, filed on Sep. 12, 2001, and a continuation-in-part of application No. PCT/US01/22661, filed on Jul. 18, 2001.

(60) Provisional application No. 60/298,789, filed on Jun. 15, 2001.

(51) Int. Cl.
*H01H 51/22* (2006.01)

(52) U.S. Cl. .......................... 335/78; 200/181

(58) Field of Classification Search ............... 335/78; 200/181
See application file for complete search history.

(56) References Cited

U.S. PATENT DOCUMENTS

| | | | |
|---|---|---|---|
| 3,984,794 A | 10/1976 | Beavitt | |
| 5,724,015 A | 3/1998 | Tai et al. | |
| 5,959,808 A | 9/1999 | Fan et al. | |
| 6,144,545 A * | 11/2000 | Lee et al. | 361/233 |
| 6,303,885 B1 * | 10/2001 | Hichwa et al. | 200/181 |
| 6,734,597 B1 * | 5/2004 | Howell et al. | 310/306 |
| 6,798,315 B1 * | 9/2004 | Schaefer | 333/105 |
| 6,856,219 B1 * | 2/2005 | Kawai | 335/78 |
| 2004/0020968 A1 * | 2/2004 | Howell et al. | 228/103 |

* cited by examiner

*Primary Examiner*—Elvin Enad
*Assistant Examiner*—Bernard Rojas

(57) ABSTRACT

A micromechanism (104) with two unique, stable configurations is disclosed. The micromechanism (104) has a base member (120) and a shuttle (122) designed to move in linear fashion. The shuttle (122) is coupled to the base member (120) via a coupling (26) in which flexible members (50, 52) are placed under axial tension in addition to bending. The coupling (26) also has a compressive member (54) that is compressed as the flexible members (50, 52) are placed in tension. The shuttle (122) has a displacement between the stable configurations that is suitable for use with thermomechanical microactuators and microswitching applications. Such a micromechanism may have multiple couplings (26), which may be disposed on either side of the shuttle (122) and may be attached to multiple base members (120). An electric return signal may be applied to the micromechanism to thermally relax the couplings (26), thereby promoting the micromechanism (104) to return from the second stable configuration to the first stable configuration. Alternatively, a separate return actuator may be used.

29 Claims, 5 Drawing Sheets

SELF-RETRACTING FULLY COMPLIANT BISTABLE MICROMECHANISM

CROSS-REFERENCE TO RELATED APPLICATIONS

This application is the National Stage of International Application PCT/US02/18769, filed Jun. 14, 2002, which claims the benefit of U.S. Provisional Application 60/298, 789, filed Jun. 15, 2001, and this application is a continuation-in-part of International Application PCT/US01/22661, filed Jul. 18, 2001 and a continuation-in-part of International Application PCT/US01/28614, filed Sep. 12, 2001.

STATEMENT OF GOVERNMENT INTEREST

This invention was made with government support under Grant Numbers DMI-9624574, DMI-9980835, and CMS-9978737, awarded by the National Science Foundation. The government has certain rights in the invention.

FIELD OF THE INVENTION

The present method and apparatus relates to dual positions mechanisims. More particularly, the invention relates to small displacement complaint bistable mechanisims with self retraction capability.

TECHNICAL BACKGROUND

The term "compliant mechanisms" relates to a family of devices in which integrally formed flexural members provide motion through deflection. Such flexural members may therefore be used to replace conventional multi-part elements such as pin joints. Compliant mechanisms provide several benefits, including backlash-free, wear-free, and friction-free operation. Moreover, compliant mechanisms significantly reduce manufacturing time and cost. Compliant mechanisms can replace many conventional devices to improve functional characteristics and decrease manufacturing costs. Assembly may, in some cases, be obviated entirely because compliant structures often consist of a single piece of material.

In microelectromechanical systems (MEMS), compliant technology allows each mechanism of a MEMS system to be an integrally formed, single piece mechanism. Because MEMS devices are typically made by a layering and etching process, elements in different layers must normally be etched and formed separately from each other. Additionally, elements with complex shapes, such as pin joints, require multiple steps and layers to create the pin, the head, the pin-mounting joint, and the gap between the pin and the surrounding ring used to form the joint. Due to the limitations of the manufacturing processes involved, the resulting pin joint often will have excessive clearance between the shaft and the hole, thereby providing excessive slop in the joint.

An integrally formed compliant mechanism, on the other hand, may be constructed as a single piece, and may even be constructed in unitary fashion with other elements of the micromechanism. Substantially all elements of many compliant devices may be made from a single layer. Reducing the number of layers, in many cases, simplifies the manufacturing and design of MEMS devices. Compliant technology also has unique advantages in MEMS applications because compliant mechanisms can be manufactured unitarily, i.e., from a single continuous piece of material, using masking and etching procedures similar to those used to form semiconductors. In certain cases, semiconductors and associated MEMS devices may even be manufactured simultaneously on the same chip.

In MEMS as well as in other applications, there exists a need for "bistable devices," or devices that can be selectively disposed in either of two different, stable configurations. Bistable devices can be used in a number of different mechanisms, including switches, valves, clasps, and closures. Switches, for example, often have two separate states: on and off. However, most conventional switches are constructed of rigid elements that are connected by hinges, and therefore do not obtain the benefits of compliant technology. Compliant bistable mechanisms have particular utility in a MEMS environment, in which electrical and/or mechanical switching at a microscopic level is desirable, and in which conventional methods used to assemble rigid body structures are ineffective.

Many mechanisms that are currently envisioned for applications such as microswitching are not truly bistable because they are not able to independently remain in two distinct positions. More precisely, such mechanisms often require the presence of a constant excitation voltage, or continuous pressure from an actuator, to keep them in one of the positions.

Furthermore, many known dual position MEMS devices have a displacement that is either too small or too large for a number of applications that require dual position motion. For example, it is desirable for a switch to have a displacement large enough to separate electrical conductors enough to ensure that arcing does not occur when the switch is open (i.e., in the "off" position). It is also desirable for the switch to have a displacement small enough to minimize the energy required to move the switch from one state to another. Many known devices do not provide sufficient electrical isolation when the switch is open, or require excessive voltage to operate. Many effective actuators have a comparatively small displacement, and are therefore incapable of moving a large displacement dual position mechanism without the use of some type of transmission. Often, bistable mechanisms often require a footprint that is excessive in relation to their displacement.

Yet further, known dual position MEMS devices typically require the use of multiple actuators. For example, many such devices require an actuator to move the device from a first position to a second position, and a second actuator to move the device from the second position back to the first position. The additional actuator requires processing time and space on the chip, thereby adding to the cost and volume of the microswitch.

Consequently, it would be an advancement in the art to provide a fully compliant MEMS device with true bistability, i.e., the ability to independently remain in either of two distinct positions. Furthermore, it would be an advancement in the art to provide a compact bistable MEMS device with a displacement that more closely corresponds with the specifications and requirements of microactuators and applications such as switching. Yet further, it would be an advancement in the art to provide a bistable MEMS device capable of independently moving from one position to another upon receipt of an electric signal.

BRIEF SUMMARY OF THE INVENTION

The present invention provides a micromechanism with true bistability, i.e., with a first stable configuration and a second stable configuration. In certain embodiments, the invention also provides a bistable micromechanism with a size and displacement suitable for use with thermomechanical actuators and switching contacts. According to some embodiments, the invention provides a bistable mechanism capable of self-retraction, i.e., motion from one stable configuration to another through the direct application of thermal energy to the micromechanism. Associated microswitches and couplings are also presented herein, in accordance with the invention.

According to one embodiment, a bistable micromechanism has a base member and a shuttle designed to translate with respect to the base member. The shuttle simply translates against a backing member, which helps restrain motion of the shuttle to a straight line. The base member is coupled to the shuttle via a coupling that is integrally formed with the shuttle and the base member, so that the micromechanism is fully compliant. More precisely, the base member has a longitudinal portion arrayed along the direction of motion of the shuttle and a lateral extension that extends toward the shuttle. The shuttle has a longitudinal portion generally parallel to the longitudinal portion of the base member and a lateral extension that extends toward the base member.

The coupling has a first flexible segment that extends from the lateral extension of the base member in a direction generally away from the shuttle. Similarly, a second flexible segment of the coupling extends from the lateral extension of the shuttle in a direction generally away from the base member. Each of the flexible segments has a small thickness so that the flexible segments can flex in a manner that generally approximates a pin joint. The flexible segments are also connected to opposite ends of a compressive segment, which has a much larger thickness.

The geometry of the coupling is such that the coupling approximates the motion of a rigid body double slider mechanism when the slider moves with respect to the base member. A pseudo-rigid body model (PRBM) may be used to analyze the motion and energy storage characteristics of the coupling.

According to the PRBM, each of the flexible segments acts as a pin joint with an attached torsional spring that simulates the restorative force of the flexible segment. The pin joint/torsional spring combination of the second flexible segment is coupled to a slider to model the linear motion of the shuttle. According to the rigid body model, the pin joint/torsional spring combinations of the flexible segments are coupled to extensions that extend into the body of the compressive segment. Collinear compression segments extend toward each other from each of the extensions and converge at a linear spring. The linear spring simulates axial compression and/or bending of the compressive segment.

When the micromechanism is in the first stable configuration, the shuttle is in a first position. When the micromechanism is in the second stable configuration, the shuttle is in a second position. The coupling is formed in an undeflected position; this position is the first stable configuration of the micromechanism. Aside from any residual stresses incident to manufacture, the flexible segments and the compressive segment are unloaded and undeflected. In response to some external force, the shuttle moves in linear fashion with respect to the first base member. The flexible segments bend and elongate, and the compressive segment is compressed. This energy storage is represented in the PRBM by torque exerted by the torsional springs and axial pressure exerted by the linear spring.

Continued motion of the shuttle results in the storage of additional strain energy by the coupling until the compressive segment reaches its most deflected position. Additional shuttle motion results in relaxation of the compressive load on the compressive segment and the tensile loads on the flexible segments, with additional torsional loading of the flexible segments. The micromechanism reaches an unstable equilibrium configuration in which the axial forces of the compressive segment and the flexible segments are balanced against the torques produced by bending of the flexible segments. This balanced configuration may be referred to as an unstable equilibrium position of the micromechanism because perturbation of the shuttle in either direction will commence releasing the stored strain energy to bring the micromechanism to either the first stable configuration or the second stable configuration.

In the unstable equilibrium configuration, the shuttle is in what may be called an unstable position. Further motion of the shuttle toward the second position results in a release of some of the stored strain energy of the coupling, which brings the shuttle to the second position without further external actuation. The micromechanism is then in the second stable configuration, in which the flexible segments store considerable strain energy via bending, but the axial loading of the flexible segments and the compressive segment is somewhat relaxed.

Storage of strain energy in the second stable configuration enables relatively easy actuation of the micromechanism from the second stable configuration back to the unstable equilibrium configuration, and thence back to the first stable configuration. Thus, the force required to "return" the micromechanism, or move it from the second stable configuration to the first stable configuration, is somewhat less than the force required for the original actuation from the first stable configuration to the second stable configuration. This characteristic facilitates self-returning of the micromechanism.

More precisely, the micromechanism may be moved from the second stable configuration to the unstable equilibrium configuration by applying an electric return signal through the micromechanism. Since the micromechanism is only semi-conductive, electric current traveling through the micromechanism encounters resistance and provides resistive heating, or "joule heating." Because the flexible segments are the thinnest portions of the micromechanism, the heating effect is focused on the flexible segments. The flexible segments elongate in response to the joule heating, thereby relaxing the tension on the flexible segments and the compression on the compressive segment. As a result, the strain energy caused by bending of the flexible segments becomes dominant, and causes the shuttle to move such that the micromechanism moves from the second stable configuration to the unstable equilibrium configuration, and thence back to the first stable configuration.

A similar micromechanism may be used in conjunction with other components to form a microswitch. The microswitch has a pair of electrically conductive contacts, an actuator, and a connector in addition to the micromechanism. The micromechanism may be symmetrical, with base members and couplings disposed on either side of a central shuttle. Thus, no backing member is needed. The micromechanism has four couplings, each of which is configured in a manner similar to that of the previous embodiment.

The actuator is a thermomechanical in-plane microactuator (TIM). The TIM also has first and second base members disposed on either side of a central shuttle. Additionally, the TIM has a plurality of legs that extend from each of the base members to the shuttle. The legs are disposed at an angle slightly offset from perpendicularity with the base members and the shuttle. In response to the passage of electric current through the TIM, the legs elongate, thereby urging the shuttle of the TIM toward the shuttle of the micromechanism.

The connector couples the shuttle of the TIM to the shuttle of the micromechanism in a manner that ensures that the shuttles will always remain aligned. More precisely, the connector has a micromechanism prong and a micromechanism plate attached to the shuttle of the micromechanism. Additionally, the connector has a pair of actuator prongs and an actuator plate attached to the actuator. The actuator prongs are disposed on either lateral side of the micromechanism prong, thereby ensuring that the shuttles of the actuator and micromechanism do not become laterally offset from each other. The actuator plate and the mechanism plate prevent the micromechanism prong from moving transversely, i.e., out of the plane of the wafer, with respect to the actuator prongs. Thus, the shuttles are constrained to remain aligned by the connector.

When the TIM receives the electric actuation signal, the actuator shuttle moves toward the micromechanism shuttle, and the actuator plate abuts the micromechanism plate. The TIM exerts force on the micromechanism shuttle until the micromechanism shuttle has moved beyond the unstable position, and the micromechanism shuttle then continues to move toward the second position without requiring further force from the TIM. Prior to reaching the second position, the micromechanism shuttle abuts the contacts. The shuttle has a conductive end, which then provides electrical communication between the contacts. Since the micromechanism is unable to reach the second stable configuration, the shuttle exerts a constant force against the contacts, which tends to enhance the conduction between the contacts and the conductive end of the shuttle.

The microswitch is then in the closed, or "on" position. When the microswitch is to be turned off again, the micromechanism receives an electric return signal that induces elongation of the flexible segments of the couplings, thereby moving the shuttle back to the first position in the manner described previously. The conductive end of the shuttle is removed from the contacts, thereby once again electrically isolating the contacts from each other.

According to one alternative embodiment, a microswitch need not be self-retuning, but may be returned to the first stable configuration through the use of a return actuator. For example, a return actuator is added to the previous embodiment in such a manner that the return actuator is able to press the micromechanism shuttle away from the contacts. The return actuator comprises a thermomechanical in-plane microactuator (TIM) similar to the actuator. The return actuator has a shuttle that extends generally between the contacts.

When the microswitch is in the closed configuration, the electric return signal is applied to the return actuator so that the shuttle of the return actuator presses the shuttle of the micromechanism away from the contacts. The return actuator continues to exert force on the shuttle of the micromechanism until the micromechanism shuttle has moved beyond the unstable position. The micromechanism shuttle then moves without the requirement of additional return force to the first position, thereby disposing the micromechanism in the first stable configuration and the switch in the open configuration. Such a return actuation system may provide enhanced operating life.

The micromechanisms, microswitches, and couplings disclosed herein may function substantially in-plane, which entails operation of each component within a single plane. Thus, the micromechanism may be made through film deposition methods similar to those used to construct flat circuits. In fact, a micromechanism according to the invention may even be made simultaneously and unitarily with a circuit so that production can be economically and rapidly carried out. Single layer or multiple layer processes may be used.

The micromechanisms of the invention also provide true bistability in that they are able to stay in each of two configurations without the presence of any continuous activation signal or external actuation force. They have size and displacement characteristics that are suited for use with thermomechanical or electrostatic microactuators, and for use in switching applications. Furthermore, in certain embodiments, they can be moved from a second stable configuration back to a first stable configuration without requiring an additional return actuator.

The purpose, function, and advantages of the present mechanism will become more fully apparent from the following description and appended claims, or may be learned by the practice of the invention as set forth hereinafter.

DETAILED DESCRIPTION OF THE INVENTION

The present apparatus and method will be best understood by reference to the drawings, wherein like parts and steps are designated by like numerals throughout. It will be readily understood that the components of the present mechanism, as generally described and illustrated in the Figures herein, could be arranged and designed in a wide variety of different configurations. Thus, the following detailed description of the embodiments of the apparatus and method, as represented in the Figures, are not intended to limit the scope of the claim, but are merely representative of present embodiments of the apparatus and method.

For this application, the phrases "connected to," "coupled to," and "in communication with" refer to any form of interaction between two or more entities, including mechanical, electrical, magnetic, electromagnetic, and thermal interaction. The phrase "attached to" refers to a form of mechanical coupling that restricts relative translation or rotation between the attached objects. The phrases "pivotally attached to" and "slidably attached to" refer to forms of mechanical coupling that permit relative rotation or relative translation, respectively, while restricting other relative motion.

The phrase "attached directly to" refers to a form of attachment by which the attached items are either in direct contact, or are only separated by a single fastener, adhesive, or other attachment mechanism. The term "abutting" refers to items that are in direct physical contact with each other, although the items may not be attached together.

Figure 1:
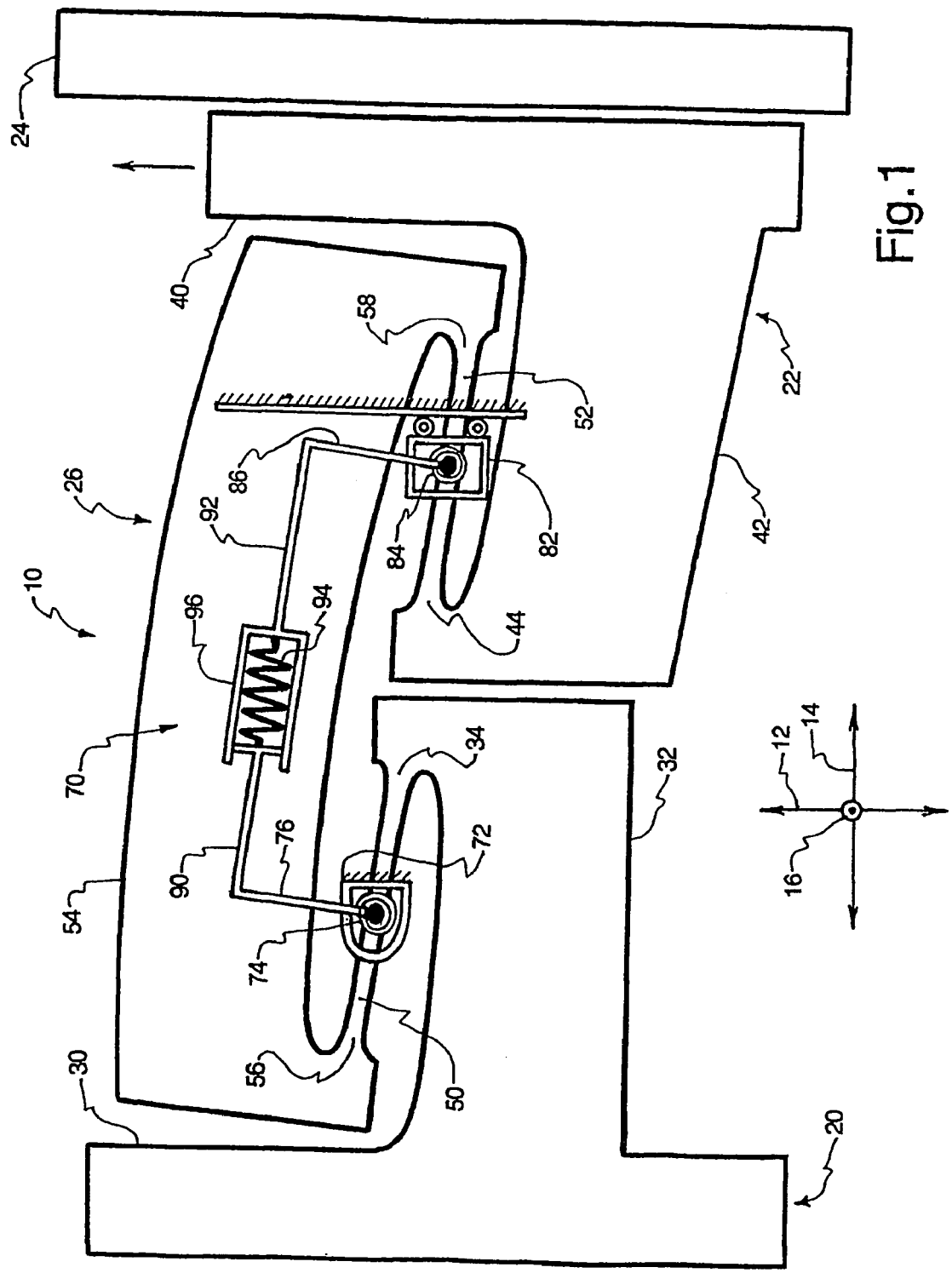
FIG. 1 is a plan view of one embodiment of a compliant bistable micromechanism according to the invention, disposed in a first stable configuration.

Referring to FIG. 1, one example of a bistable micromechanism 10, or micromechanism 10, is shown in a first stable configuration. The micromechanism 10 is sized for MEMS applications. Although many of the examples presented herein apply to MEMS applications, the present invention is not limited to MEMS, but is rather applicable to compliant mechanisms in general.

The exemplary micromechanism 10 of FIG. 1 is a bistable micromechanism, or a MEMS device that can be actuated between two stable configurations. The micromechanism 10 may be used to perform microswitching functions or the like. The micromechanism 10 may have a longitudinal direction 12, a lateral direction 14, and a transverse or out-of-plane direction 16. The micromechanism 10 is formed through the use of a multi-layer process such as MUMPS, and may therefore have components on multiple planes in the transverse direction 16. In the alternative, a bistable micromechanism may have a substantially planar configuration, e.g., all parts of the mechanism may have substantially the same thickness and positioning in the transverse direction 16.

As shown in FIG. 1, the micromechanism 10 has a base member 20 and a shuttle 22 designed to move in the longitudinal direction 12 with respect to the base member 20. In FIG. 1, the micromechanism 10 is in the first stable configuration, and the shuttle 22 is in a first position that corresponds to the first stable configuration.

The micromechanism 10 also has a backing member 24 against which the shuttle 22 slides; the backing member 24 keeps the shuttle 22 from moving significantly in the lateral direction 14. The base member 20 and the shuttle 22 are coupled together by a coupling 26 that stores potential energy in such a manner that the micromechanism 10 has two unique, stable configurations separated by an unstable equilibrium configuration. The manner in which the coupling 26 acts to provide bistable operation will be described in greater detail subsequently.

As shown in FIG. 1, the base member 20 has a longitudinal portion 30 oriented generally along the longitudinal direction 12 and a lateral extension 32 that extends generally in the lateral direction 14 from the longitudinal portion 30. The coupling 26 is coupled to the lateral extension 32 at an anchoring point 34 on the lateral extension 32. Similarly, the shuttle 22 has a longitudinal portion 40 oriented generally along the longitudinal direction 12 and a lateral extension 42 that extends generally in the lateral direction 14 from the longitudinal portion 40. The coupling 26 is coupled to an anchoring point 44 on the lateral extension 42.

In compliant mechanisms, small-length flexural pivots are thin cross-sectioned segments that replace traditional pivotal joints while still allowing the joint to be mathematically modeled as a traditional pivotal joint. Small-length flexural pivots bend along their length to allow other elements of a micromechanism to move relative to each other. Small-length flexural pivots can have a wide variety of lengths and shapes to suit multiple designs. Longer small-length flexural pivots allow for a large range of motion, while shorter pivots are easier to model with techniques, such as pseudo-rigid body modeling.

Flexural pivots are often loaded in bending and axial compression. As a result, the flexural pivot enters a buckling condition and relatively large deflection occurs. The result is a relatively large displacement of the compliant mechanism, and a relatively high stress in the flexural pivot.

The present invention utilizes flexible segments, termed "tensural pivots," that are loaded with a combination of bending and axial tension. The use of tensural pivots avoids buckled beam conditions and utilizes stress stiffening to reduce the displacement of the mechanism. Furthermore, by avoiding buckling, tensural pivots are subject to comparatively smaller stresses, which enhances the life of the mechanism under a constant load or, especially, under fatigue loading conditions. Additionally, tensural pivots can be relaxed through the use of thermal expansion, which may enable tensural pivots to change shape, or even toggle, in response to the application of electric current.

In the micromechanism 10 of FIG. 1, tensural pivots are incorporated into the coupling 26. More precisely, the coupling 26 has a first flexible segment 50 extending from the anchoring point 34 of the base member 20 and a second flexible segment 52 extending from the anchoring point 44 of the shuttle 22. The flexible segments 50, 52 have a small thickness within the plane in which the micromechanism 10 generally resides. Thus, the flexible segments 50, 52 are able to bend within the plane to approximate the pivotal motion provided by a pin joint.

Each of the flexible segments 50, 52 has a length-to-width ratio selected to provide bending with the desired degree of energy storage. The length or width of the flexible segments 50, 52 may easily be adjusted to modify the energy storage or bending properties of the flexible segments 50, 52. The width of the flexible segments 50, 52 may have a minimum value imposed by the manufacturing process used to form the micromechanism 10. For example, if a MUMPS process is used, the flexible segments 50, 52 may be required to have a width of at least about two microns.

In the first stable configuration, which is shown in FIG. 1, the flexible segments 50, 52 are substantially undeflected, and therefore unstressed, aside from the presence of any residual stresses incident to the manufacturing process. Thus, the flexible segments 50, 52 are each substantially straight, and are generally collinear with each other. Each of the flexible segments 50, 52 acts as a tensural pivot because motion of the shuttle 22 from the first position toward a second position corresponding to the second stable configuration (i.e., in the direction shown by the arrow) exerts bending and axial tension on both of the flexible segments 50, 52.

The coupling 26 also has a compressive segment 54 attached to the first flexible segment 50 at a base anchoring point 56 and to the second flexible segment 52 at a shuttle anchoring point 58. As shown, the compressive segment 54 has a slightly curved shape with a thickness much larger than that of the flexible segments 50, 52. Hence, the compressive segment 54 can store considerable strain energy with a comparatively small change in length. If desired the compressive segment 54 may have a different shape, such as a V-shape, a straight shape, or a more sharply curved shape. Such shapes may be used to vary the strain energy stored by the compressive segment 54 as a function of the motion of the shuttle 22.

In the first stable configuration of FIG. 1, the compressive segment 54 is also undeflected and unstressed, aside from any residual stresses. Since any perturbation of the shuttle 22 away from the first position results in an increase in strain energy stored by the coupling 26, and therefore a return of the shuttle 22 toward the first position, the configuration of FIG. 1 represents a stable equilibrium. Motion of the shuttle 22 toward the second position induces compression and bending of the compressive segment 54 by virtue of the tension on the first and second flexible segments 50, 52, which tends to draw the base and shuttle anchoring points 56, 58 of the compressive segment 54 toward each other.

The micromechanism 10 obtains its dual position stability from the existence of two low potential energy positions. The use of potential energy changes to provide bistability provides better control and a larger range of design possibilities than the implementation of residual stress or buckled beam methods. The micromechanism 10 of FIG. 1 uses the energy storage capabilities of the flexible segments 50, 52 and the compressive segment 54 to create two low potential energy positions.

The coupling 26 may be configured in a wide variety of ways, aside from that shown in FIG. 1. Many other embodiments may utilize tension in combination with bending to provide small deflection, bistable motion between the base member 20 and the shuttle 22. The configurations of the base member 20, and shuttle 22 could similarly be altered to adapt them for use with a coupling having a different configuration.

The use of compliant technology enables a bistable mechanism, such as the micromechanism 10, to be produced without conventional, separate members and joints. The functions of such members and joints are instead carried out by integrally formed elements that allow for motion similar to that of conventional mechanisms. While a compliant structure can provide motion and displacement similar to that of designs involving conventional rigid elements, the design process for a compliant mechanism has obstacles not present in the case of conventional mechanisms utilizing separate, rigid parts. For example, the flexible segments 50, 52 are loaded in both bending and axial tension. Thus, multiple forces and torques simultaneously act on the flexible segments 50, 52. Additionally, comparatively large deflections may occur.

As a result, directly determining how the flexible segments 50, 52 respond to motion of the shuttle 22 requires complex non-linear equations. The complexity of these equations makes it difficult to obtain closed form mathematical relationships to characterize the potential energy storage of the coupling 26. Hence, with traditional methods of analysis, it is difficult to create a compliant structure that functions in the desired manner, let alone optimize the structure for a desired function. The process of designing and optimizing a compliant structure can be simplified by modeling a compliant structure as a mechanism with rigid members connected with conventional joints and springs. Such a model may be called a "pseudo-rigid body model," or PRBM.

Referring again to FIG. 1, a pseudo-rigid body model 70, or PRBM 70, of the coupling 26 is superimposed on the coupling 26. The various elements of the PRBM 70 do not physically exist within the micromechanism 10, but are simply used as tools for analysis.

According to the PRBM 70, the first flexible segment 50 is modeled as a stationary pin joint 72. The stationary pin joint 72 is positioned in the middle of the first flexible segment 50 because the first flexible segment 50 is short enough that bending of the first flexible segment 50 over a limited range of motion is roughly equivalent to pivotal motion about its center. The bending resistance of the first flexible segment 50 is represented by a torsional spring 74. A first extension 76 represents the attachment of the first flexible segment 50 to the compressive segment 54.

The second flexible segment 52 is modeled as a sliding pin joint 82, which moves only in the longitudinal direction 12 to approximate motion of the shuttle 22. As with the stationary pin joint 72, the sliding pin joint 82 is positioned at the center of the second flexible segment 52. A torsional spring 84 simulates the bending resistance of the second flexible segment 52. A second extension 86 represents the attachment of the second flexible segment 52 to the compressive segment 54.

A first compression segment 90 and a second compression segment 92 extend toward each other from the ends of the first and second extensions 76, 86, respectively. The first and second compression segments 90, 92 represent the length of the compressive segment 54 between the stationary pin joint 72 and the sliding pin joint 82. A linear spring 94 is positioned within an enclosure 96 between the first and second compression segments 90, 92 of the PRBM 70 to simulate the combined axial forces of tension in the flexible segments 50, 52 and compression in the compressive segment 54, as well as any bending of the compressive segment 54 that occurs.

Values may be ascribed to the various elements of the PRBM 10 for purposes of analysis. For example, each of the extensions 76, 86 and compression segments 90, 92 has a length, and the linear spring 94 and torsional springs 74, 84 have associated spring constants. These values may be derived from the geometry of the flexible segments 50, 52 and the compressive segment 54. Thicker elements are analogous to springs with large spring constants, and therefore resist deformation more than elements that would be modeled with a smaller spring constant.

Once the geometry of the PRBM 70 has been fully described, tools of conventional kinematic analysis can then be applied to the PRBM 70 to determine the motion and energy storage characteristics of the coupling 26, and thence the entire micromechanism 10. The micromechanism 10 may be manufactured in the first stable configuration, as depicted in FIG. 1. Thus, the axial and bending loads on the flexible segments 50, 52 and the compressive segment 54 may be assumed to be approximately zero. This condition is represented in the PRBM 70 by zero deflection in the linear spring 94 and in the torsional springs 74, 84. The manner in which the coupling 26 stores energy to provide dual position stability will be further described in connection with FIGS. 2 and 3, with continued reference to the PRBM 70.

Figure 2:
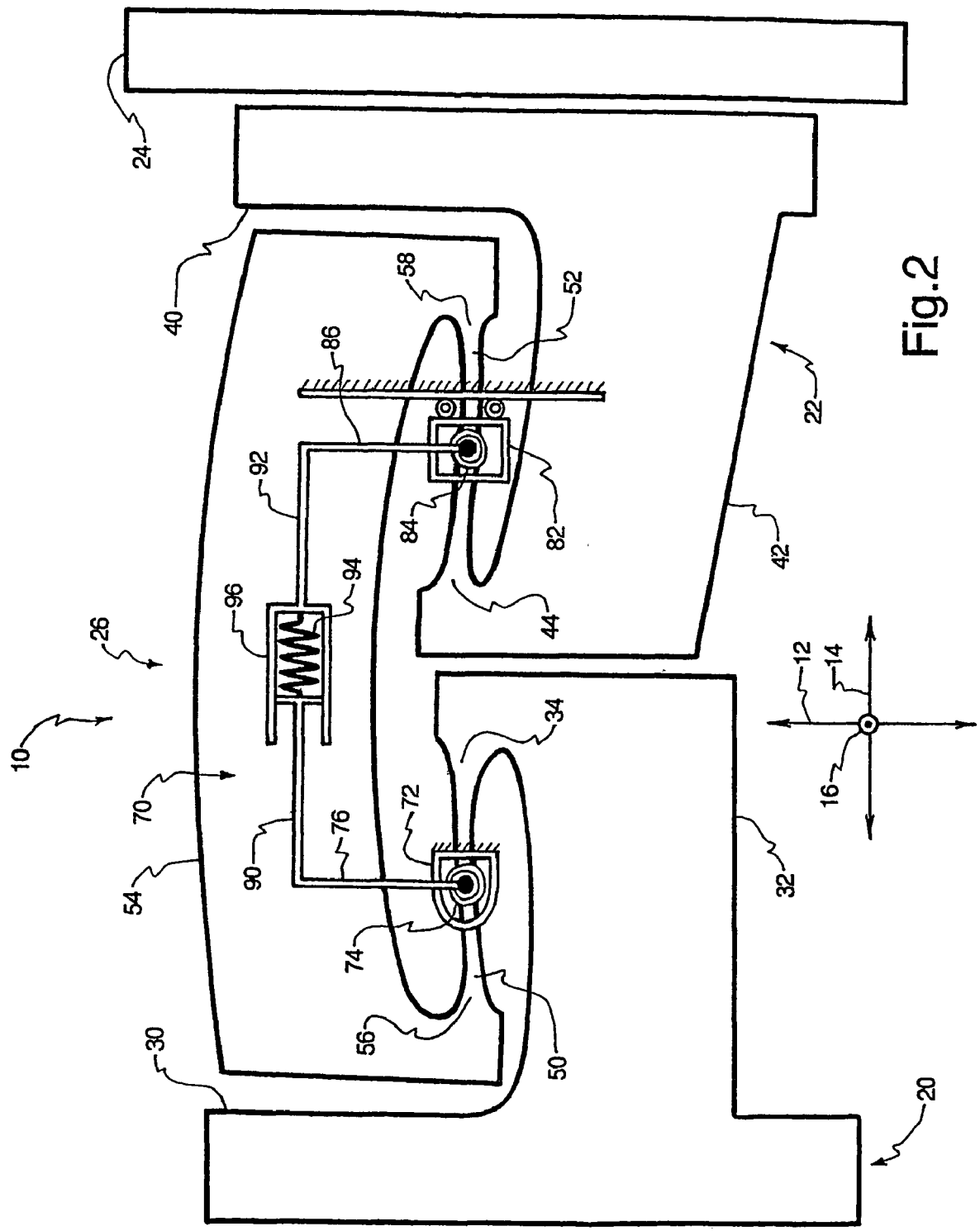
FIG. 2 is a plan view of the compliant bistable micromechanism of FIG. 1, disposed in an unstable equilibrium configuration.

Referring to FIG. 2, the micromechanism 10 of FIG. 1 is shown in an unstable equilibrium configuration, with the PRBM 70 once again superimposed over the coupling 26. As shown, the shuttle 22 has been moved by some external force in the longitudinal direction 12 to an unstable position corresponding to the unstable equilibrium configuration of the micromechanism 10. As a result, the center of the flexible segment 52 coupled to the shuttle 22 has been moved longitudinally, past the center of the flexible segment 50 coupled to the base member 20. Consequently, the flexible segments 50, 52 have each been forced to bend. Additionally, the ends of the flexible segments 50, 52 adjoining the anchoring points 34, 44 have been drawn closer together to place the flexible segments 50, 52 in tension and to place the compressive segment 54 in a combination of axial compression and bending.

In the PRBM 70, the sliding pin joint 82 has moved longitudinally, past the longitudinal position of the stationary pin joint 72. The bending of the flexible segments 50, 52 is represented in the PRBM 70 by rotational deflection of the torsional springs 74, 84, which is not generally discernable in FIG. 2. The axial loading of the flexible segments 50, 52 and the axial and bending loading of the compressive segment 54 are indicated by compression of the linear spring 94, which is clearly visible in FIG. 2. The sliding pin joint 82 has moved in the longitudinal direction 12 to simulate the longitudinal motion of the shuttle 22.

In the unstable equilibrium configuration of FIG. 2, the coupling 26 stores strain energy that tends to move the shuttle 22 in either longitudinal direction. More specifically, the flexible segments 50, 52 bend in proportion to the advancement of the shuttle 22 from the first position to the second position. Consequently, their resilient force continually urges the shuttle 22 to move back toward the first position.

By contrast, the axial tension on the flexible segments 50, 52, as well as the bending and axial compression on the compressive segment 54, reach their maximum approximately when the centers of the flexible segments 50, 52, represented by the pin joints 72, 82, are aligned in the longitudinal direction 12. This maximum energy storage level is represented by maximum compression of the linear spring 94. As the shuttle 22 moves from the first position toward the second position, the axial tension on the segments 50, 52, 54 and the bending of the compressive segment 54 urge the shuttle 22 to move back to the first position. However, when the center of the second flexible segment 52 moves longitudinally beyond the center of the first flexible segment 50, the axial tension on the segments 50, 52, 54 and the bending of the compressive segment 54 begin to decrease. Thus, the shuttle 22 is urged toward the second position.

In the unstable equilibrium configuration of FIG. 2, the center of the flexible segment 52 has moved longitudinally beyond the center of the flexible segment 50. Hence, while the bending resistance of the flexible segments 50, 52 urges the shuttle 22 back toward the first position, the axial strain of the segments 50, 52, 54 and the bending strain of the compressive segment 54 exert an equal force that urges the shuttle 22 toward the second position. With any significant motion of the shuttle 22 from the unstable position, the axial load on the segments 50, 52, 54 and the bending of the compressive segment 54 may become the dominant force over bending of the flexible segments 50, 52. Hence, slight perturbation of the shuttle 22 in either longitudinal direction results in continued motion of the shuttle, independent of any continued actuation force, in the same direction until the shuttle 22 reaches either the first position or the second position.

Figure 3:
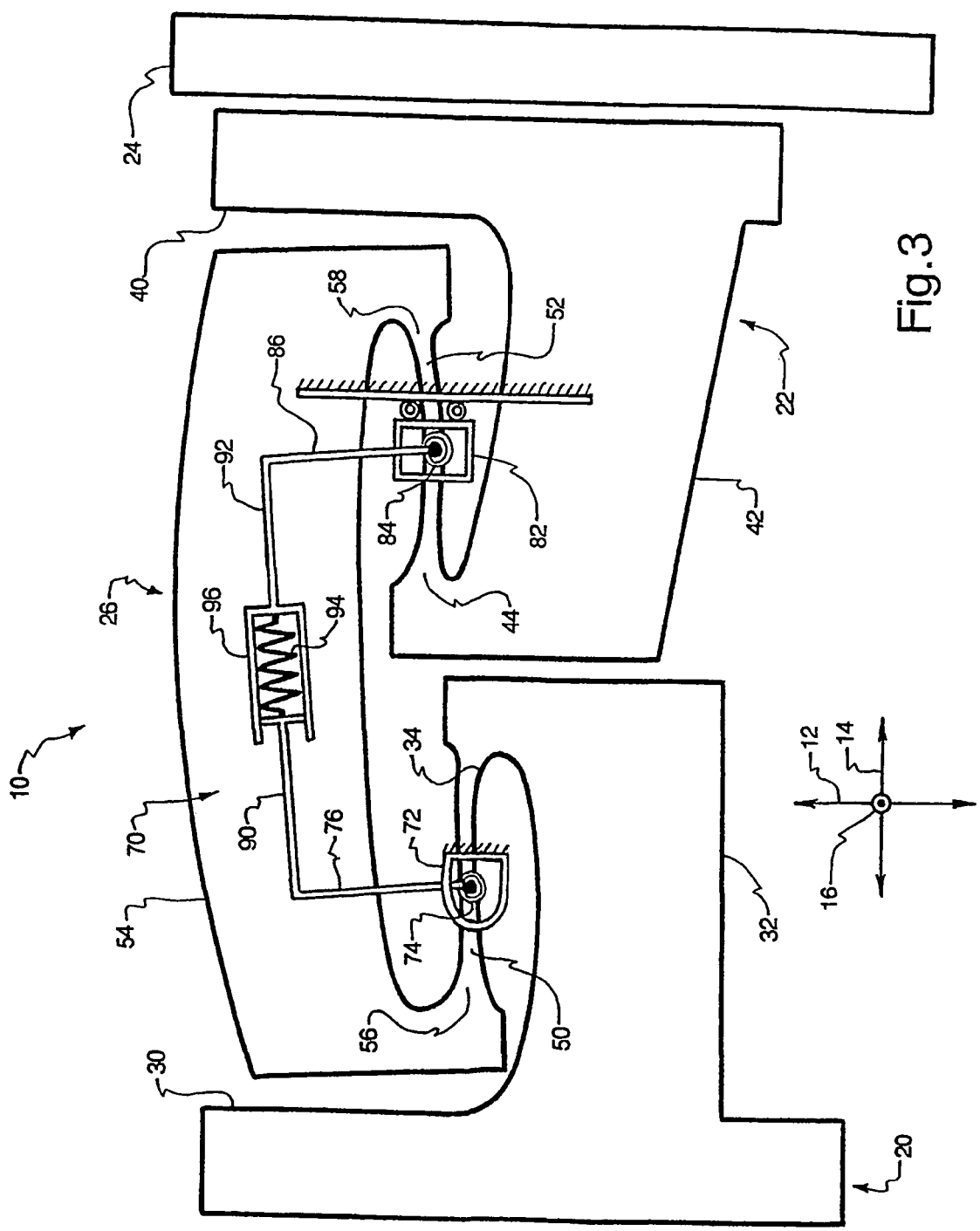
FIG. 3 is a plan view of the compliant bistable micromechanism of FIG. 1, disposed in a second stable configuration.

Referring to FIG. 3, a plan view shows the micromechanism 10 in the second stable configuration. The shuttle 22 has been moved beyond the unstable equilibrium configuration of FIG. 2; hence, the shuttle 22 continued to move as strain energy was released by the coupling 26 until the shuttle 22 reached a new stable equilibrium at the second position. More specifically, the axial loading of the segments 50, 52, 54 and the bending load of the compressive segment 54 are relieved as the shuttle 22 moves from the unstable position to the second position. This is represented by the more relaxed state of the linear spring 94 in FIG. 3, which is not entirely undeflected as in FIG. 1.

Simultaneously, the bending loads on the flexible segments 50, 52 intensify. The second stable configuration is the configuration in which the axial loading of the segments 50, 52, 54 and the bending load of the compressive segment 54, represented by deflection of the linear spring 94, are again balanced against the bending loads of the flexible segments 50, 52, which are represented by the torsional springs 74, 84.

Thus, the equilibrium of the second stable configuration is obtained through a balance of forces similar to that of the unstable equilibrium configuration. However, despite the continued existence of strain energy within the coupling 26, the equilibrium of the second stable configuration is stable like that of the first stable configuration because slight perturbation of the shuttle 22 results in a return of the shuttle 22 to the second stable configuration. However, the stored strain energy within the coupling 26 in the second stable configuration may somewhat reduce the force required to move the shuttle from the second position back to the first position.

Consequently, the force required to move the micromechanism 10 from the first stable configuration to the second stable configuration may be larger than the force required to move the micromechanism 10 from the second stable configuration to the first stable configuration. According to one embodiment, a force of approximately 120 μN is required to move the micromechanism 10 from the first stable configuration to the second stable configuration, and a force of approximately 38 μN is required for return actuation. Such a difference between toggle forces may be desirable for certain applications, such as microswitching. Furthermore, the comparatively low required return force may facilitate self-return actuation of the micromechanism 10 from the second stable configuration to the first stable configuration. However, the micromechanism 10 may be adapted to provide a wide number of ratios between required actuation and return forces. Such adaptation may be carried out depending on the specific implementation of the micromechanism 10.

Advantageously, the micromechanism 10 provides a small displacement of the shuttle 22, while still maintaining true bistability, with a minimum footprint size. In this application, "displacement" refers to linear displacement of the output member (for example, the shuttle 22), not to angular displacement of supporting elements such as the flexible segments 50, 52. The displacement of the shuttle 22 is necessarily relative to the process limited minimum feature size, or the smallest feature that can be used for the manufacturing process used to form the micromechanism 10. Thus, for microscale devices, small displacement denotes microscale displacements on the order of the minimum feature size.

For example, if the micromechanism is manufactured using a process such as MUMPS, the minimum feature size may be about 2 microns. The first and second positions of the shuttle 22 may be separated by a distance ranging from about 5 microns to about 15 microns. Furthermore, the shuttle 22 may have a displacement ranging from about 7 microns to about 13 microns. Yet further, the shuttle 22 may have a displacement of about 11 microns. The displacement of the shuttle 22 is thus approximately five or six times the minimum feature size. Such displacement values correspond generally to the displacements of typical microactuators, and are also suitable for switching applications.

For nanoscale devices, mesoscale devices, or even macroscale devices, the displacement of such a mechanism may again be on the order of the minimum feature size. The configuration of the micromechanism 10 may be readily adapted for production on any relative scale. A variety of manufacturing process may be used, including, but not limited to, surface micromachining techniques such as MUMPS or SUMMIT V, bulk micromachining, LIGA, and macroscale molding or machining.

A bistable mechanism made by any such process may have a displacement rating, which is defined as the quantity consisting of 10,000 multiplied by the square of the minimum feature size, divided by the quantity consisting of the displacement multiplied by the size of the device. The displacement rating characterizes the ability of a bistable mechanism to achieve a small displacement by comparison with the minimum feature size, while also maintaining a small overall footprint by comparison with the minimum feature size. The displacement rating may be considered as the ratio of minimum feature size over displacement multiplied by the ratio of minimum feature size over mechanism size, multiplied by a constant, i.e., 10,000. The displacement rating is greater for mechanisms with smaller footprints, smaller displacements, and larger feature sizes. Known mechanisms tend to have a comparatively small displacement rating.

Of the values used to obtain the displacement rating, the minimum feature size is the smallest feature that can be created with the process. As mentioned previously, the displacement is the linear displacement of the output member. If no output member is present, it is the largest linear displacement found in the mechanism. The displacement includes the full distance between stable linear positions of the mechanism, even if electrical contacts or other structures obstruct motion of the mechanism along its full displacement.

The size of the device is the width (i.e., in the lateral direction 14, perpendicular to the direction of linear bistable motion) of the mechanism, excluding any symmetrical elements. Hence, if there were a base member and coupling (not shown) disposed on the opposite side of the shuttle 22 from the coupling 26, in a symmetrical disposition, such components would not be included in the calculation of the size of the micromechanism 10 because they could be omitted without altering the displacement of the micromechanism 10.

By way of example, the micromechanism 10 may be manufactured using the MUMPS process, which has a minimum feature size of approximately 2 microns, as mentioned previously. The micromechanism 10 may have a linear output displacement of approximately 11 microns, and a size of approximately 120 microns. Using the formula provided above, the displacement rating for the micromechanism 10 is about 30.3.

A somewhat smaller micromechanism (not shown) with a similar configuration may be made with the SUMMIT V process. The SUMMIT V process has a minimum feature size of about 0.7 microns. Such a micromechanism may have a displacement of about 4.5 microns and a size of about 100 microns. The displacement rating for such a micromechanism is about 10.9.

A bistable mechanism according to the invention may advantageously have a displacement rating above about 7.0. Furthermore, such a bistable mechanism may have a displacement rating above about 10. Yet further, such a bistable mechanism may have a displacement rating above about 15. Still further, such a bistable mechanism may have a displacement rating above about 20. Even further, such ah bistable mechanism may have a displacement rating above about 30.

Returning to the micromechanism 10 of FIG. 3, an electric return signal may, if desired, be applied directly to the micromechanism 10 to induce the coupling 26 to relax, thereby permitting the micromechanism 10 to return from the second stable configuration to the first stable configuration. For example, a voltage may be applied to the base member 20 and the backing member 24. The backing member 24 and the shuttle 22 are close enough that current will flow relatively freely between them; hence, current flows through the micromechanism 10, or more precisely, through the coupling 26. The current encounters considerable resistance within the flexible segments 50, 52 due to the small thickness of the flexible segments 50, 52. Consequently, resistance heating, or "joule heating," occurs and the flexible segments 50, 52 elongate. In the alternative, heat could be applied in any other way, such as through the use of a laser.

Since the flexible segments 50, 52 are in tension near the second stable configuration, thermal expansion enables them to relax. As the flexible segments 50, 52 lengthen, the compressive segment 54 rotates in a clockwise direction toward the position of FIG. 1. Motion of the coupling 26 draws the shuttle 22 toward the unstable position. If current continues to be applied, the shuttle 22 will reach the unstable position, and the coupling 26 will reach a state corresponding to the unstable equilibrium configuration. Once the shuttle 22 passes the unstable position, the micromechanism 10 will tend to return to the first stable configuration when the electric return signal is discontinued. The flexible segments 50, 52 may be required to sustain a temperature increase on the order of 450° C. in order to effectuate a return from the second stable configuration to the first stable configuration.

Without the application of the electric return signal, or a return force against the shuttle 22, the micromechanism 10 remains in the second stable configuration. The micromechanism 10 may be adapted to suit the stability requirements of any given application. Stability relates to the ability of a bistable micromechanism to remain in the desired stable configuration under normal operating conditions, e.g., without deliberate actuation from the desired stable configuration.

Generally, the stability of a bistable mechanism is proportional to the force required to toggle the mechanism from one stable configuration to another stable configuration. A mechanism requiring a small force to toggle the mechanism is not as stable as a mechanism that requires a large force. Similarly, a highly stable mechanism will require a comparatively larger force to actuate the mechanism between different stable configurations. A high input force may place excessive energy burdens on a system, especially in MBMS applications, in which energy consumption is limited. In such applications, minimizing the toggle force may be desirable.

However, stability may be compromised if the toggle force is too low. For example, vibrations that occur from outside the system may toggle a bistable mechanism with a small input force requirement. Therefore, the application and energy requirements must be considered when selecting a bistable mechanism design.

One method of increasing stability of a bistable micromechanism without altering its displacement is to increase the number of energy storing elements in the bistable micromechanism. Adding energy storing elements also increases the force required to move the micromechanism from one stable configuration to another. Such a configuration will be shown and described in greater detail with reference to a switching application, in connection with FIG. 4.

Figure 4:
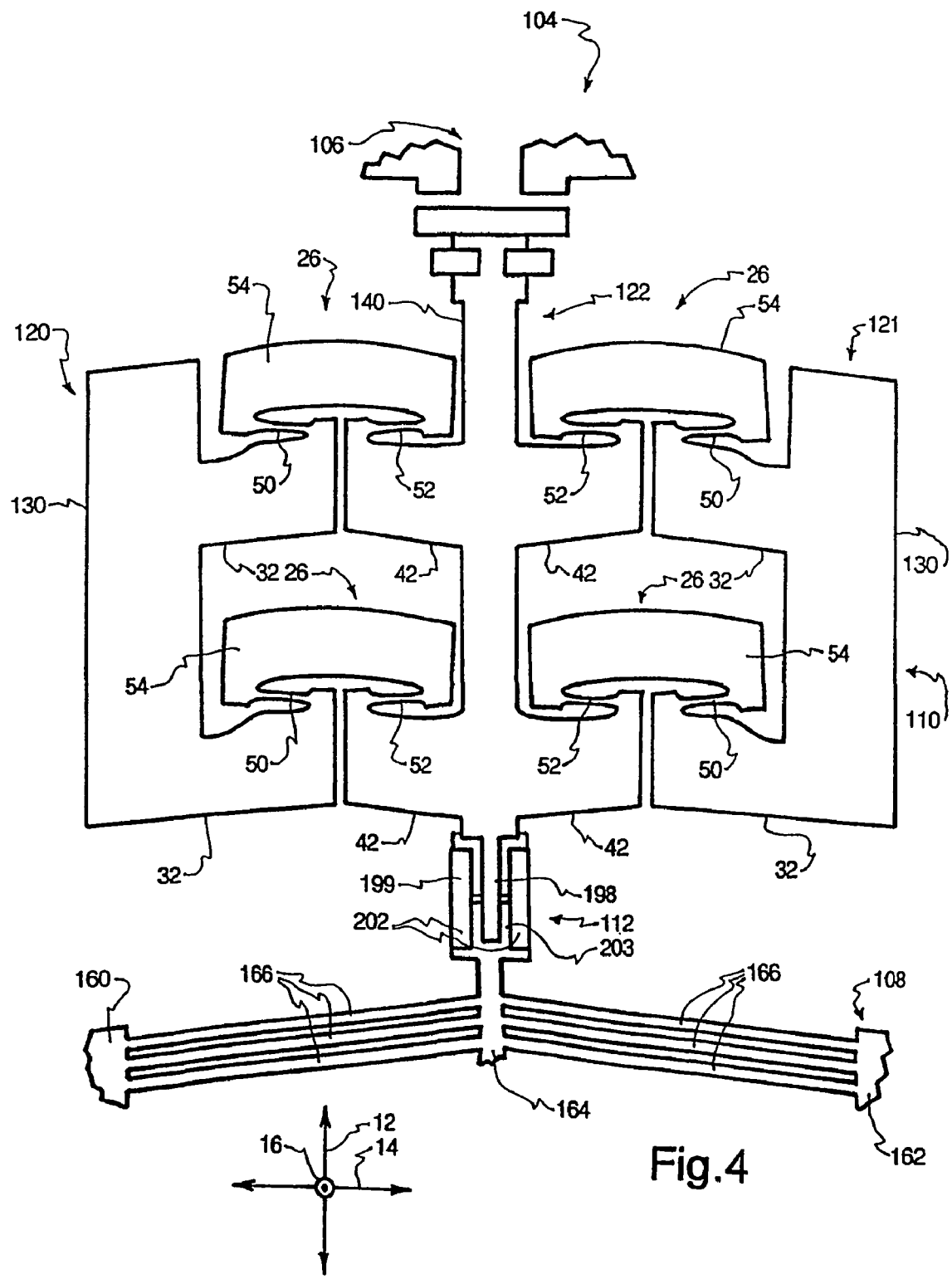
FIG. 4 is a plan view of a microswitch incorporating a bistable micromechanism similar in operation to the bistable micromechanism of FIG. 1, in which electric current is directly applied to the micromechanism to move the microswitch from the closed configuration to the open configuration.

Referring to FIG. 4, a plan view of one embodiment of a microswitch 104 is depicted. The microswitch 104 incorporates a pair of electrical contacts 106, which are to be electrically coupled when the microswitch 104 is in the "on," or closed position, but not when the microswitch 104 is in the "off," or open position. An actuator 108 is used to actuate a micromechanism 110 from a first stable configuration, in which the electrical contacts 104 are not connected, to a second stable configuration, in which the micromechanism 110 bridges the gap between the electrical contacts 106 to permit electricity to flow between the electrical contacts 106. The actuator 108 is slidably connected to the micromechanism 110 via a connector 112. In FIG. 4, the micromechanism 110 is shown in the first stable configuration, so that the microswitch 104 is in the "off" position.

The micromechanism 110 operates in a manner similar to that of FIGS. 1 through 3. However, the micromechanism 110 is symmetrical along the lateral direction 14. More precisely, the micromechanism 110 has a first base member 120 and a second base member 121 disposed opposite the first base member 120. A shuttle 122 is disposed between the base members. Since the base members 120, 121 cooperate to keep the shuttle 122 from moving significantly in the lateral direction 14, no backing member 24 is needed. Instead, the shuttle 122 is coupled to the first base member 120 by two couplings 26 and to the second base member 121 by two additional couplings 26.

Each of the base members 121, 122 has a longitudinal portion 130 extending in the longitudinal direction 12. Lateral extensions 32 extend generally inward from the base members 120, 121, toward the shuttle 122. Similarly, the shuttle 122 has a longitudinal portion 140 oriented generally parallel to the longitudinal portions 130 of the base members 121, 122. Lateral extensions 42 extend generally outward from the shuttle 122, toward the base members 120, 121.

The couplings 26 of FIG. 4 may be identical to those of FIGS. 1 through 3, or may, in a different configuration, be adapted to provide the desired force and/or displacement characteristics for the micromechanism 110. Hence, the couplings 26 of the micromechanism 110 may each have a first flexible segment 50, a second flexible segment 52, and a compressive segment 54. Although the PRBM 70 of FIGS. 1 through 3 is not shown in FIG. 4, the energy storage and motion characteristics described in connection with the PRBM 70 apply to the micromechanism 110 of FIG. 4. Due to the use of additional couplings 26, the micromechanism 110 may have comparatively higher input force requirements to move the micromechanism 110 between the first and second stable configurations. Such a higher requirement also provides additional stability, as described previously.

The actuator 108 may take the form of a thermomechanical in-plane microactuator, or TIM 108. The TIM 108 has a first base member 160, a second base member 162, and a shuttle 164 designed to be movable with respect to the base members 160, 162. A plurality of legs 166 extend from each of the base members 160, 162 to the shuttle 164 at an angle slightly offset from the lateral direction 14. When an electric actuation signal passes through the TIM 108, i.e., between the first and second base members 160, 162, resistance to the current induces joule heating within the legs 166, thereby causing the legs 166 to lengthen. The legs 166 may expand relatively proportionately in all directions, or may be configured for preferential thermal expansion along their length. In any case, the legs 166 elongate to press the shuttle 164 in the longitudinal direction 12, toward the shuttle 122 of the micromechanism 110.

The micromechanism 110 may be triggered in a wide variety of ways besides through the use of the TIM 108. For example, the micromechanism 110 may be moved from the first stable configuration to the second stable configuration through the use of other types of linear or rotary thermal actuators, electrostatic actuators such as comb drives, or even by the force of acceleration against the shuttle 122 of the micromechanism 122.

The shuttle 164 of the TIM 108 is slidably coupled to the shuttle 122 of the micromechanism 110 by the connector 112. The connector 112 is designed to ensure that the shuttles 122, 164 remain aligned in the lateral direction 14 and in the transverse direction 16. Hence, the connector 112 has a micromechanism prong 198 that extends in the longitudinal direction 12 from the micromechanism shuttle 122, and a micromechanism plate 199 disposed underneath the micromechanism prong 198 in the transverse direction 16. Similarly, the connector 112 also has a pair of actuator prongs 202 that extend in the longitudinal direction 12 from the shuttle 164, and an actuator plate 203 disposed underneath the actuator prongs 202 in the transverse direction 16.

The actuator prongs 202 are disposed on either side of the micromechanism prong 198 so that the actuator prongs 202 are unable to move relative to the micromechanism prong 198 in the lateral direction 14. Furthermore, the micromechanism prong 198 is unable to move in the transverse direction 16 past the actuator plate 203, and the actuator prongs 202 are unable to move in the transverse direction 16 past the micromechanism plate 199. Consequently, relative motion between the micromechanism prong 198 and the actuator prongs 202 is restricted in either transverse direction 16. Thus, the shuttle 164 is constrained by the connector 112 to remain in alignment with the shuttle 122 of the micromechanism 110.

When the shuttle 164 moves toward the micromechanism 110, the actuator plate 203 may abut the micromechanism plate 199 and press against it, thereby pressing the shuttle 122 toward the electrical contacts 106. As mentioned previously, the micromechanism 110 operates in a manner similar to that of the micromechanism 10 of FIGS. 1 through 3. The shuttle 122 reaches an unstable position induced by strain energy stored within the couplings 26, and further motion of the shuttle 122 toward the electrical contacts 106 causes the strain energy to release somewhat, thereby drawing the shuttle 122 toward the second position.

The electrical contacts 106 may be positioned such that the shuttle 122 abuts the electrical contacts 106 and, as a consequence, stops moving prior to reaching the second stable configuration. If desired, the electrical contacts 106 may further be positioned such that the shuttle 122 abuts the electrical contacts 106 when the force exerted on the shuttle 122 by the couplings 26 reaches its maximum value. Thus, the shuttle 122 exerts a constant force tending to keep the end of the shuttle 122 relatively tightly pressed against the electrical contacts 106. The end of the shuttle 122 may have a metallic coating or attached metal member that electrically couples the electrical contacts 106 together, thereby causing the microswitch 104 to be in the "on" position.

Due to the bistability of the micromechanism 110, the microswitch 104 will remain in the "on" position without the presence of any constant actuation signal. Thus, the electric actuation signal may be decoupled from the TIM 108 so that the TIM 108 can return to a relaxed state. The microswitch 104 does not return to the "off" position until acted upon by some external force or electric return signal.

When the microswitch 104 is to be returned to the "off" position, an electric return signal may be applied across the micromechanism 110. For example, a voltage applied to the base members 120, 121 would induce the passage of current through the couplings 26, and hence through the flexible segments 50, 52. In the same manner described in connection with FIG. 3, the electric return signal induces elongation of the flexible segments 50, 52, thereby causing the couplings 26 to relax until the micromechanism 110 returns to the first stable configuration. The shuttle 122 is thus drawn away from the electrical contacts 106 to once again electrically isolate the electrical contacts 106 from each other.

Figure 5:
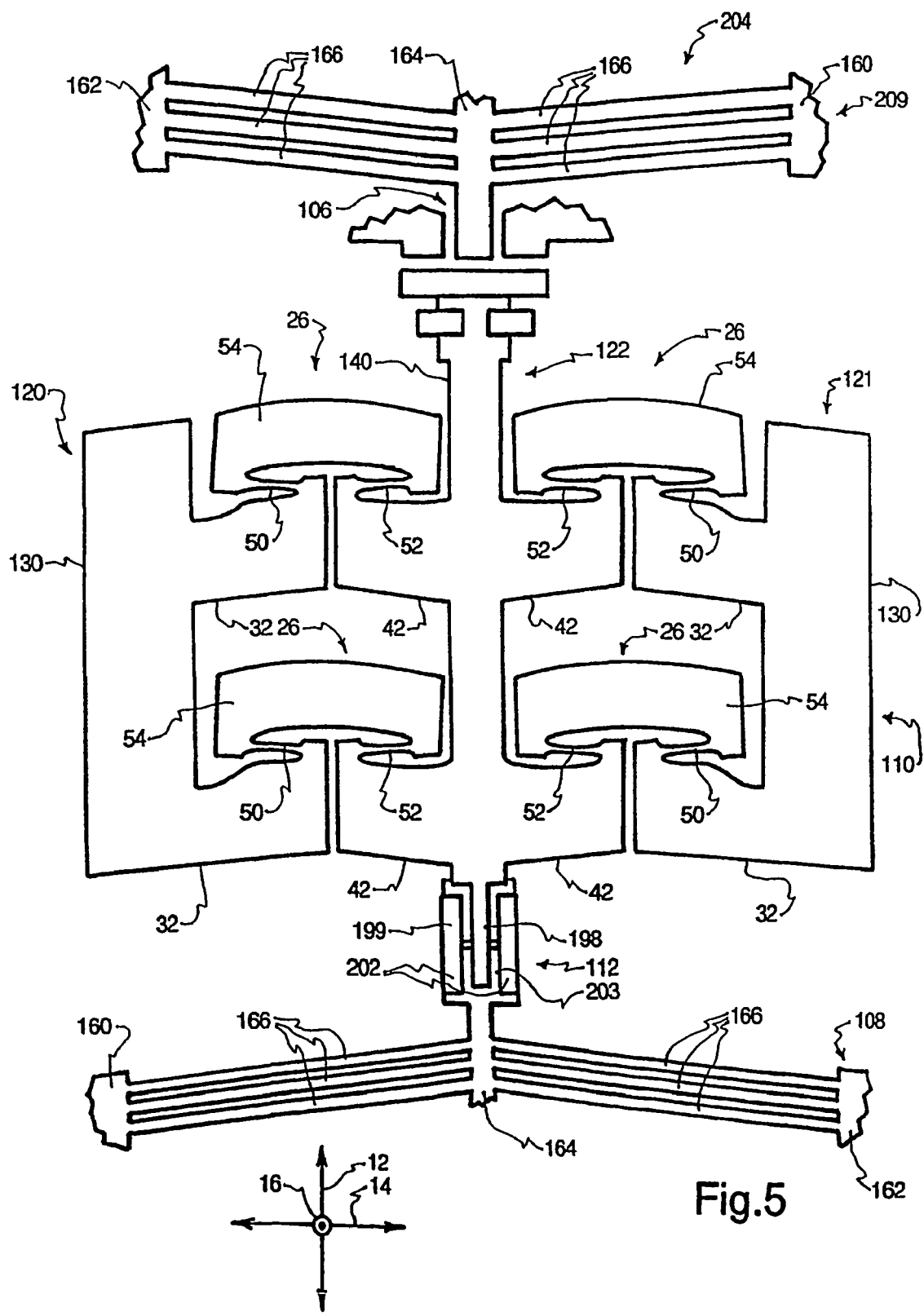
FIG. 5 is a plan view of an alternative embodiment of a microswitch that incorporates a return actuator to move the microswitch from the closed configuration to the open configuration.

Thus, no separate return actuator is required to move the microswitch 104 from the "on" position to the "off" position. However, when the microswitch 104 is to operate over many rapid cycles, it may be desirable to avoid the repeated application of high temperatures to the flexible segments 50, 52. Additionally, it may be desirable to provide some type of redundant mechanism for tuning off the microswitch 104, in case self-return actuation is ineffective. A second actuator may also be used as the primary mechanism for turning off the microswitch 104, while self-return actuation is reserved as a back-up. FIG. 5 illustrates one embodiment that incorporates an additional return actuator.

Referring to FIG. 5, a plan view illustrates an alternative embodiment of a microswitch 204 according to the invention. The microswitch 204 has a configuration similar to that of the microswitch 104, except that the microswitch 204 also includes a return actuator 209. As shown, the return actuator 209 may take the form of a thermomechanical in-plane microactuator, or TIM 209, similar to the TIM 108. Hence, the TIM 209 may also have first and second base members 160, 162 disposed on either side of a shuttle 164 and a plurality of legs 166 that extend from the base members 160, 162 to the shuttle 164.

When the microswitch 204 is to be actuated form the "on" position to the "off" position, an electric return signal is applied, not to the micromechanism 110, but to the TIM 209. The legs 166 of the TIM 209 elongate in response to the application of the electric return signal, thereby urging the shuttle 164 toward the shuttle 122 of the micromechanism 110. As shown, the shuttle 164 of the TIM 209 may be positioned to extend generally between the electrical contacts 106 to abut against the center of the shuttle 122 of the micromechanism 110. Due to the placement of the electrical contacts 106, and the widened configuration of the portion of the shuttle 122 that abuts against the electrical contacts 106, no connector may be needed to maintain alignment between the shuttle 164 of the TIM 209 and the shuttle 122 of the micromechanism 110.

The shuttle 164 of the TIM 209 presses the shuttle 122 away from the electrical contacts 106 until the shuttle 122 passes the unstable position. Then, the micromechanism 110 moves of its own accord back to the first stable configuration (shown in FIG. 5), thereby moving the microswitch 204 to the "off" position. The TIM 209 may then be allowed to retract to avoid obstructing motion of the shuttle 122 back toward the electrical contacts 106 when the microswitch 204 is to be moved back to the "on" position.

As with the TIM 108, a wide variety of other actuator types may alternatively be used to provide return actuation of the micromechanism 110. The TIM 209 may also be used as a backup to self-return actuation of the micromechanism 110, or vice versa. Thus, redundant retraction capability may be provided.

Through the use of the microactuators, microswitches, and couplings of the present invention, bistable motion may be provided in a manner that enhances a wide variety of MEMS applications. Micromechanical devices can be maintained in one of two stable positions without the application of a continuous maintenance signal. Displacements suitable for use with thermomechanical actuators and switching applications may also be obtained. Furthermore, if desired, self-return actuation may be utilized to obviate a separate return actuator.

The mechanisms disclosed herein may be modified in many other ways to suit a wide variety of applications. The invention may be embodied in other specific forms without departing from its structures, methods, or other essential characteristics as broadly described herein and claimed hereinafter. The described embodiments are to be considered in all respects only as illustrative, and not restrictive. The scope of intellectual property rights is, therefore, indicated by the appended claims, rather than by the foregoing description. All changes that come within the meaning and range of equivalency of the claims are to be embraced within their scope.

The invention claimed is:

1. A self-retracting micromechanism having a first stable configuration and a second stable configuration, the micromechanism comprising:
    a first base member disposed along a plane;
    a shuttle configured to move along a substantially linear path parallel to the plane, the shuttle having a first position corresponding to the first stable configuration and a second position corresponding to the second stable configuration; and
    a first coupling coupled to the first base member and the shuttle, the first coupling having a first configuration that positions the shuttle in the first position and a second configuration that positions the shuttle in the second position, wherein the first coupling is configured to move from the second configuration to the first configuration in response to receipt of an electric return signal, wherein the electric return signal is applied to said first coupling.

2. The micromechanism of claim 1, wherein the first base member, the shuttle, and the first coupling are unitarily formed so that the micromechanism is movable between the first and second stable configurations via compliant joints.

3. The micromechanism of claim 1, wherein the first coupling is coupled to at least one of the shuttle and the first base member via a pin joint.

4. The micromechanism of claim 1, further comprising:
    a second base member disposed along the plane and positioned such that the shuttle is between the first and second base members; and
    a second coupling coupled to the second base member and the shuttle, the second coupling having a first configuration that positions the shuttle in the first position and a second configuration that positions the shuttle in the second position, wherein the second coupling is configured to move from the second configuration to the first configuration in response to receipt of the electric return signal, wherein the electric return signal is applied to said second coupling.

5. The micromechanism of claim 4, further comprising:
    a third coupling coupled to the first base member and the shuttle; and
    a fourth coupling coupled to the second base member and the shuttle, each of the third and fourth couplings having a first configuration that positions the shuttle in the first position and a second configuration that positions the shuttle in the second position, wherein each of the third and fourth couplings is configured to move from the second configuration to the first configuration in response to receipt of the electric return signal, wherein the electric return signal is applied to said third and fourth couplings.

6. The micromechanism of claim 1, wherein the first coupling comprises:
 a first flexible segment extending from the first base member in a direction generally away from the shuttle;
 a second flexible segment extending from the shuttle in a direction generally away from the first base member; and
 a compressive segment connected to the first and second flexible segments such that motion of the shuttle from the first position toward the second position exerts tension on the first and second flexible segments, thereby compressing the compressive segment.

7. The micromechanism of claim 6, wherein passage of the electric return signal through the first and second flexible segments induces elongation of the first and second flexible segments, thereby relaxing the coupling to move the shuttle from the second position toward the first position.

8. The micromechanism of claim 1, wherein the shuttle further has an unstable position between the first and second positions to provide an unstable equilibrium configuration of the micromechanism.

9. The micromechanism of claim 8, wherein a force required to move the shuttle from the first position to the unstable position is greater than a force required to move the shuttle from the second position to the unstable position.

10. The micromechanism of claim 1, wherein the first and second positions are separated by a displacement selected such that a displacement rating of the micromechanism, defined as the quantity consisting of 10,000 multiplied by the square of a minimum feature size of the micromechanism, divided by the quantity consisting of the displacement multiplied by a lateral size of the micromechanism, is above about 7.0.

11. The micromechanism of claim 10, wherein the displacement is selected such that a displacement rating of the micromechanism is above about 20.

12. The micromechanism of claim 6, wherein the first base member, the first and second flexible segments, and the compressive segment are unitarily formed so that the first coupling is reconfigurable via compliant joints.

13. The micromechanism of claim 6, wherein the flexible segments and the compressive segment are further connected such that the first coupling has an unstable equilibrium configuration through which the first coupling moves during motion between the first and second configurations.

14. The micromechanism of claim 6, wherein the first coupling moves between the first and second configurations in response to relative linear motion between the first and second members.

15. The micromechanism of claim 6, wherein the first coupling is disposed substantially along a single plane.

16. The micromechanism of claim 15, wherein each of the first and second flexible segments has a comparatively small thickness along the plane, so that each of the first and second flexible segments is capable of flexing in a manner that generally approximates pivotal motion.

17. The micromechanism of claim 6, wherein the compressive segment is slightly bowed such that the compressive segment further bends in response to tension from the first and second flexible segments.

18. A method for actuating a self-retracting micromechanism from a first stable configuration to a second stable configuration, the method comprising:
 exerting force against a shuttle of the micromechanism with an actuator to press the shuttle toward a second position, thereby deflecting a coupling such that at least a portion of the coupling is in tension, wherein the micromechanism comprises a first base member disposed along a plane and a first coupling coupled to the first base member and the shuttle, wherein the shuttle is configured to move along a substantially linear path parallel to the plane, the shuttle having a first position corresponding to the first stable configuration and the second position corresponding to the second stable configuration, wherein the first coupling has a first configuration that positions the shuttle in the first position and a second configuration that positions the shuttle in the second position, wherein the first coupling is configured to move from the second configuration to the first configuration in response to receipt of an electric return signal applied to said first coupling; and
 moving the shuttle toward the second position until the coupling deflects beyond an unstable equilibrium configuration of the coupling, so that the coupling exerts force on the shuttle tending to move the shuttle to the second position.

19. The method of claim 18, wherein exerting force against the shuttle comprises applying an electric actuation signal to induce motion of a thermomechanical, in-plane microactuator positioned proximate the shuttle.

20. The method of claim 18, wherein the coupling comprises a first flexible segment extending from the base member in a direction generally away from the shuttle, a second flexible segment extending from the shuttle in a direction generally away from the base member, and a compressive segment connected to the first and second flexible segments, wherein moving the shuttle toward the second position comprises exerting tension on the first and second flexible segments, thereby compressing the compressive segment.

21. The method of claim 20, further comprising stopping motion of the shuttle before the shuttle reaches the second position so that the coupling continues to urge the shuttle toward the second position.

22. The method of claim 20, further comprising the steps of:
 applying heat resulting from the electric return signal to at least a portion of the coupling to induce relaxation of the coupling, thereby permitting motion of the shuttle toward the first position; and
 further relaxing the coupling to move the shuttle toward the first position until the coupling deflects beyond an unstable equilibrium configuration of the coupling, so that the coupling exerts force on the shuttle tending to move the shuttle to the first position.

23. The method of claim 22, wherein the coupling comprises a first flexible segment extending from the base member in a direction generally away from the shuttle, a second flexible segment extending from the shuttle in a direction generally away from the base member, and a compressive segment connected to the first and second flexible segments, wherein applying heat to at least a portion of the coupling comprises applying an electric return signal to the flexible segments to induce elongation of the flexible segments, thereby inducing relaxation of the coupling.

24. The micromechanism of claim 1, further comprising a plurality of electrical contacts disposed to be electrically isolated from each other when the micromechanism is in the first stable configuration and in electrical communication with each other when the micromechanism is proximate the second stable configuration.

25. The micromechanism of claim 24, wherein the electrical contacts are positioned to stop motion of the shuttle toward the second position so that the micromechanism is able to press against the electrical contacts to maintain electrical communication between the electrical contacts when the shuttle is proximate the second position.

26. The micromechanism of claim 24, wherein the micromechanism is a microswitch.

27. The micromechanism of claim 1, further comprising an actuator configured to move the micromechanism from the first stable configuration to the second stable configuration in response to receipt of an electric actuation signal.

28. The micromechanism of claim 27, wherein the actuator comprises a thermomechanical in-plane microactuator having legs configured to elongate in response to receipt of the electric actuation signal, wherein the actuator is positioned to exert force against the shuttle in response to expansion of the legs.

29. The micromechanism of claim 28, further comprising a connector that slidably connects the thermomechanical in-plane microactuator to the micromechanism to maintain alignment between the thermomechanical in-plane microactuator and the micromechanism.

* * * * *